United States Patent
Trobough (12)

(10) Patent No.: US 7,278,858 B1
(45) Date of Patent: Oct. 9, 2007

(54) SOCKET WITH INTEGRAL, RETRACTABLE SOCKET CONTACT PROTECTOR

(75) Inventor: Mark Trobough, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/390,615

(22) Filed: Mar. 27, 2006

(51) Int. Cl.
*H01R 12/00* (2006.01)
*H05K 1/00* (2006.01)

(52) U.S. Cl. .......................................... 439/71; 439/140
(58) Field of Classification Search .................. 439/71, 439/140, 141, 70
See application file for complete search history.

(56) References Cited

U.S. PATENT DOCUMENTS

| | | | |
|---|---|---|---|
| 4,684,184 A | * | 8/1987 | Grabbe et al. ................. 439/64 |
| 6,722,896 B2 | * | 4/2004 | McGrath et al. .............. 439/71 |
| 6,971,887 B1 | | 12/2005 | Trobough |

\* cited by examiner

*Primary Examiner*—Javaid H. Nasri
(74) *Attorney, Agent, or Firm*—David L. Guglielmi

(57) ABSTRACT

In some embodiments, a socket with integral, retractable socket contact protector is presented. In this regard, a contact protector is introduced to protect contacts, and to provide openings through which the contacts can emerge to couple with lands. Other embodiments are also disclosed and claimed.

4 Claims, 3 Drawing Sheets

… (1)

SOCKET WITH INTEGRAL, RETRACTABLE SOCKET CONTACT PROTECTOR

FIELD OF THE INVENTION

Embodiments of the present invention generally relate to the field of sockets, and, more particularly to a socket with integral, retractable socket contact protector.

BACKGROUND OF THE INVENTION

In computing devices, processors are placed in sockets which are soldered onto a substrate. In some cases, when a person or machine places a processor in a socket incorrectly or with too much force there can be damage to the socket contacts that may require the motherboard to be replaced. Damage to sockets can be costly and time consuming to a computer manufacturing operation.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
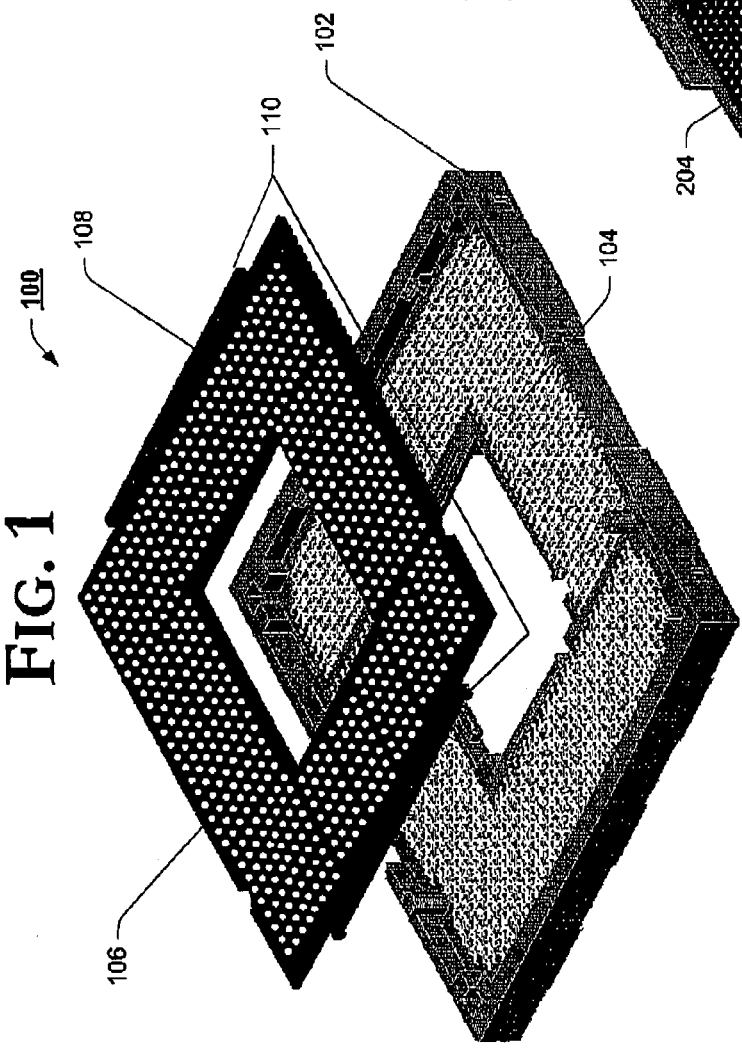
FIG. 1 is a diagram of a socket and a socket contact protector, in accordance with one example embodiment of the invention.

FIG. 1 is a diagram of a socket and a socket contact protector, in accordance with one example embodiment of the invention. In accordance with the illustrated example embodiment, assembly 100 may include socket housing 102, socket contacts 104 and socket contact protector 106. Socket contact protector 106 includes openings 108 and integrated springs 110 as shown in FIG. 1.

Socket housing 102 is usually made of plastic and provides the structural support and limited protection for internal mechanisms of the socket, for example socket contacts 104. Additionally, the shape of socket housing 102 may provide alignment features for both socket contact protector 106 and a device package intended to mate with the socket.

Socket contacts 104 are often thin metal strip formed and cut in a particular shape which provide electrical coupling with pads of a device package. Socket contacts made be of other materials and shapes. In one embodiment, socket contacts 104 rise from the base of socket housing 102 at an angle and are curved at the top end. In this embodiment, socket contacts 104 will tend to move down and out slightly when a downward force is applied, for example when a device package is mated with the socket. This movement of socket contacts 104 is colloquially referred to as a wiping action.

Socket contact protector 106, when installed in socket housing 102, is designed to protect socket contacts 104 from potential damage and contains openings 108 through which socket contacts 104 can emerge to couple with a device package. Openings 108 may be circular or any other shape to accommodate the particular shape of the socket contacts and penetration of socket contacts 104 through socket contact protector 106, including accommodating any wiping action of socket contacts 104. In one embodiment, socket contact protector 106 is a substantially planar, thin, injection-molded plastic table. Socket contact protector 106 may also include integrated springs 110 to provide a means for captivating socket contact protector 106 within socket housing 102 and a means for transitioning socket contact protector 106 between up and down positions as described in greater detail hereinafter.

Figure 2:
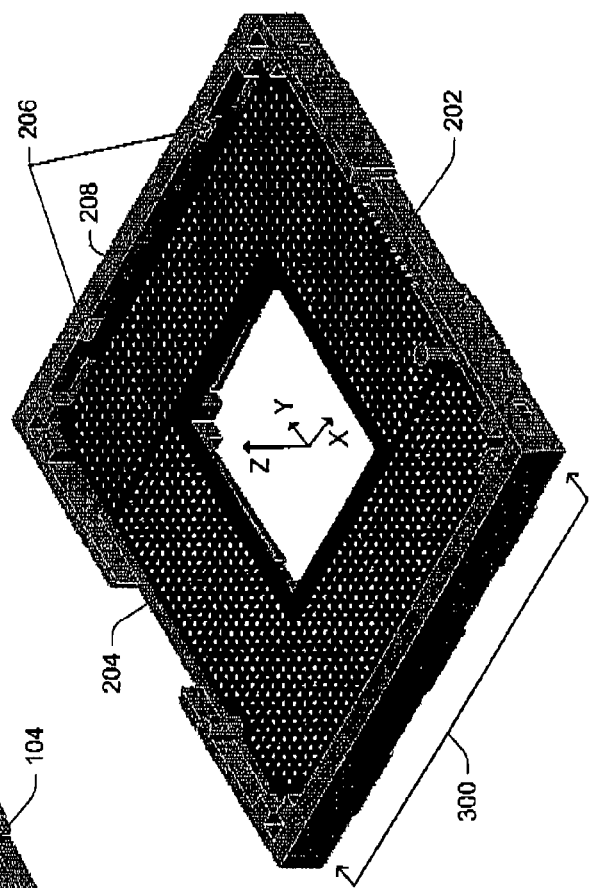
FIG. 2 is a diagram of a socket with integral, retractable socket contact protector, in accordance with one example embodiment of the invention.

FIG. 2 is a diagram of a socket with integral, retractable socket contact protector, in accordance with one example embodiment of the invention. In accordance with the illustrated example embodiment, device package socket 200 may include socket housing 202, socket contact protector 204, tabs 206, and integrated springs 208 coupled as shown in FIG. 2.

Socket contact protector 204, which was molded to align in shape and dimensions within the contact field of device package socket 200, is shown installed and captivated within socket housing 202 after integrated springs 208 (and possibly others not shown) have been snapped under tabs 206. When there is no force placed on socket contact protector 204, and therefore no compression of integrated springs 208, the top surface of socket contact protector 204 extends slightly above the contacts of device package socket 200. When a force is placed on socket contact protector 204, for example when a device package is installed in device package socket 200, integrated springs 208 are compressed and socket contact protector 204 retracts (or lowers along the z-axis) exposing the contacts of device package socket 200 which emerge through corresponding openings in socket contact protector 204. Through designed alignment with socket housing 202 and integrated springs 208, socket contact protector 204 is able to move through a slight up and down range in the z-axis, but is constrained to very limited movement in the x-axis or y-axis given the close x-y fit between features on the contact protector and corresponding features in the socket housing. One skilled in the art would appreciate that the physical alignment of socket contact protector 204 within socket housing 202 can facilitate proper installation of socket contact protector 204 into socket housing 202.

Figure 3A:
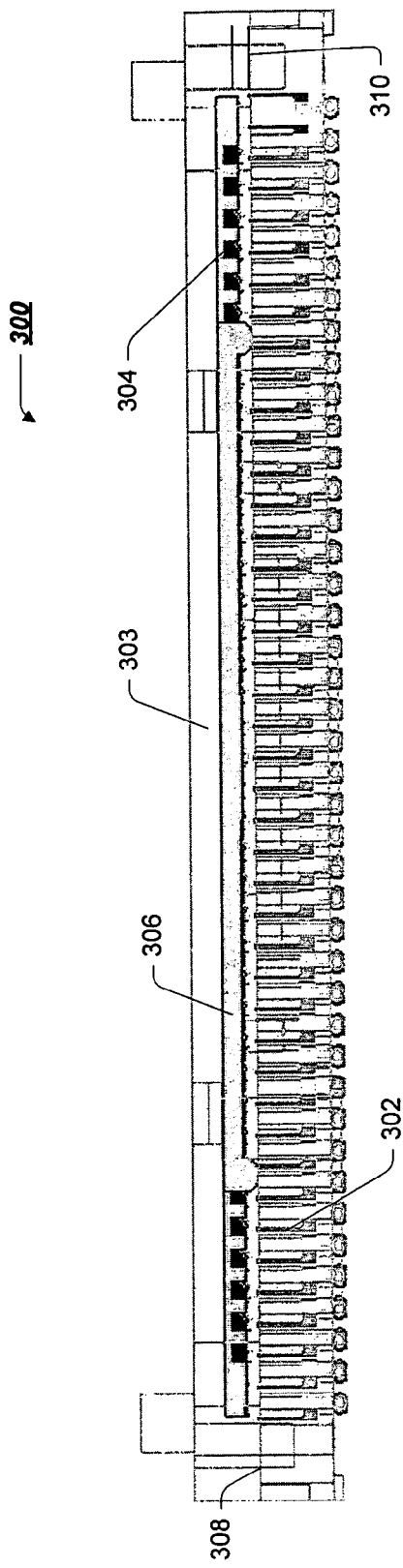
FIGS. 3A-3B are cross-sectional views of an example socket with integral, retractable socket contact protector, in accordance with one example embodiment of the invention.
Figure 3B:
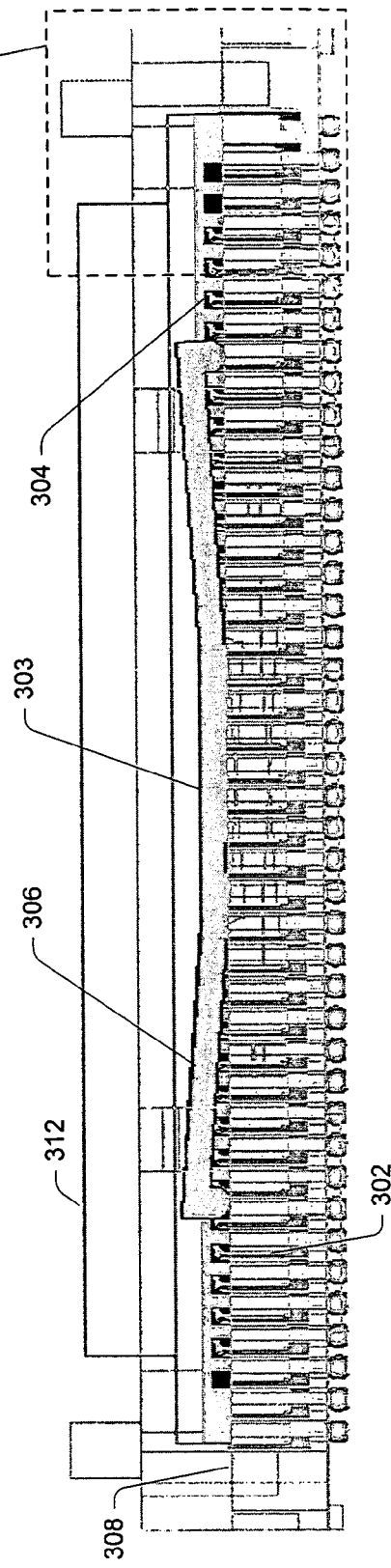

FIGS. 3A-3B are cross-sectional views of an example socket with integral, retractable socket contact protector, in accordance with one example embodiment of the invention. In accordance with the illustrated example embodiment, view 300 of device package socket 200 includes socket contacts 302, socket contact protector 303, openings 304, integrated spring 306, socket base 308, and vertical space 310, coupled as shown in FIG. 3A.

Socket contacts 302 are aligned with corresponding openings 304 in socket contact protector 303. The top surface of socket contact protector 303 in this example is above socket contacts 302, providing protection which would be recognized by one skilled in the art. Vertical space 310 is the distance which the bottom of socket contact protector 303 is suspended above socket base 308. In one embodiment, this distance is about 0.4 mm. While as shown integrated spring 306 maintains vertical space 310 by acting on socket base 308, other configurations or types of springs or mechanical means may be utilized to provide vertical space 310.

FIG. 3B depicts view 300 of device package socket 200 with the addition of device package 312. In this example embodiment, an actuation force has been applied to seat device package 312, possibly through the use of, for example, a socket lever or metal clip (not shown). This actuation force pushes socket contact protector 303 down until it contacts socket base 308. As socket contact protector 303 is forced down, socket contacts 302 emerge through openings 304. Socket contacts 302 are then able to contact pads, for example land grid array (LGA) pads, of device package 312. If the actuation force were removed, integrated spring 306 would unload and return socket contact protector 303 to the up position depicted in FIG. 3A.

Figure 4:
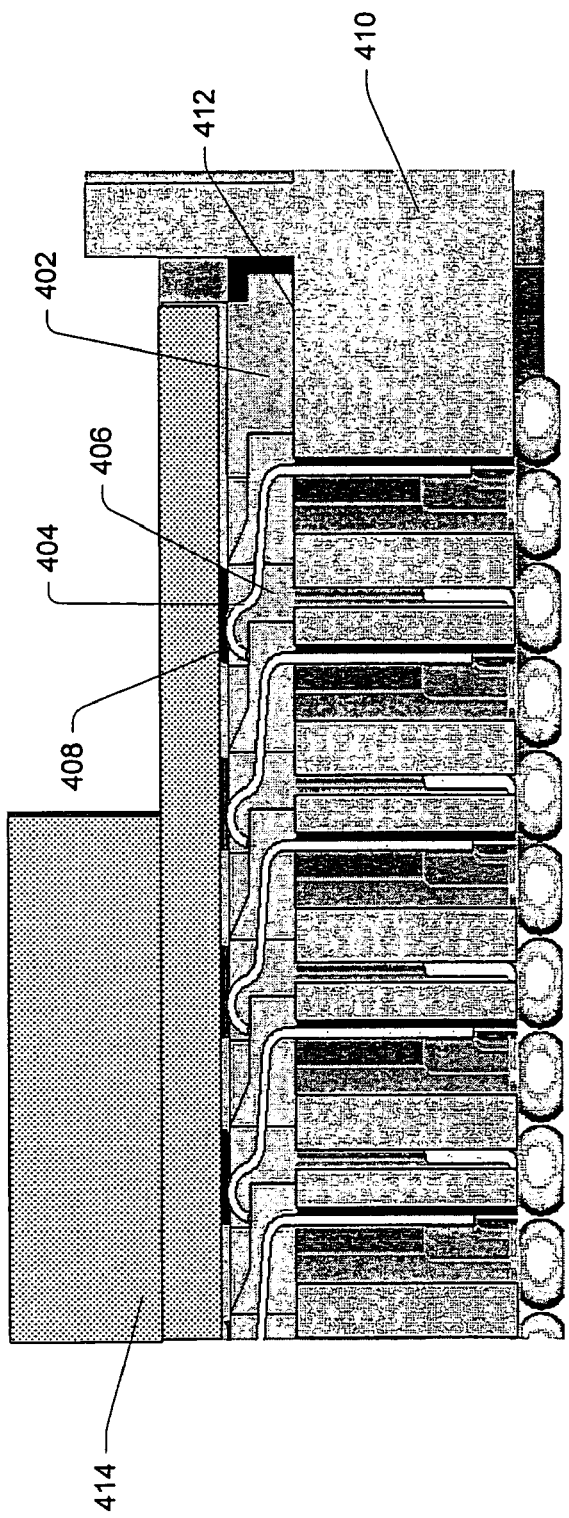
FIG. 4 is a cross-sectional view of an example socket with integral, retractable socket contact protector, in accordance with one example embodiment of the invention.

FIG. 4 is a cross-sectional view of an example socket with integral, retractable socket contact protector, depicting view 400 in FIG. 3B. As shown, socket contact 404 is extending through opening 406 of table 402 to contact land 408 of device package 414. To achieve the coupling of socket contact 404 and land 408, a downward force would be applied to device package 414 thereby forcing table 402 down onto surface 412 of socket housing 410. Land 408 is a conductive element of a land grid array (LGA). One skilled in the art would appreciate that while shown as part of a device package socket, the contact protector of the present invention can be applied to protect contacts in any number of applications, including but not limited to power connectors, I/O connectors, or other connections where a contact is to couple with a LGA-style land.

Figure 5:
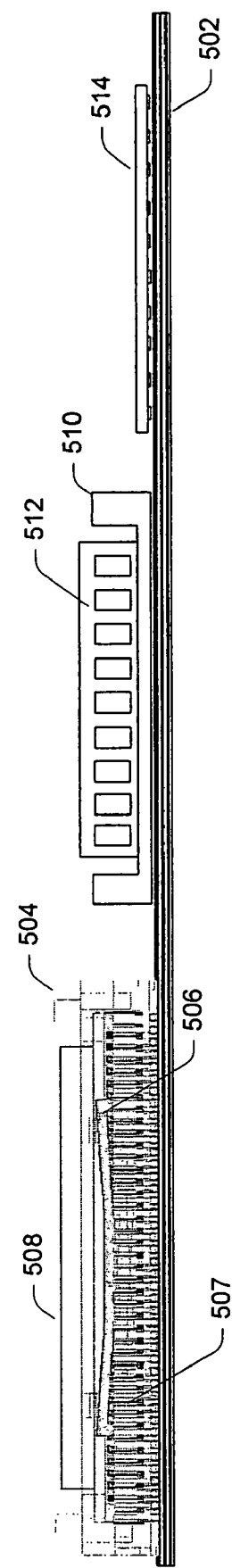
FIG. 5 is a cross-sectional view of an example electronic appliance incorporating a socket with integral, retractable socket contact protector, in accordance with one example embodiment of the invention.

FIG. 5 is a cross-sectional view of an example electronic appliance incorporating a socket with integral, retractable socket contact protector, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include substrate 502, processor socket 504, socket contact protector 506, socket contacts 507, processor 508, memory socket 510, memory module 512, and network controller 514 coupled as shown in FIG. 5.

Substrate 502 may be a fiberglass motherboard with components soldered to it. For example, socket contacts 507, memory socket 510 and network controller 514 may be soldered to a surface of substrate 502. Conductive elements, either on a surface of or embedded within substrate 502, provide the means for electrically coupling the various components with one another.

Processor socket 504 may include socket contacts 507 and a socket contact protector 506 as depicted in FIGS. 1, 2, 3A, or 3B.

Processor 508 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect.

Memory module 512 may represent any type of memory device(s) used to store data and instructions that may have been or will be used by processor 508. Typically, though the invention is not limited in this respect, memory module 512 will consist of dynamic random access memory (DRAM). In one embodiment, memory module 512 may consist of Rambus DRAM (RDRAM). In another embodiment, memory module 512 may consist of double data rate synchronous DRAM (DDRSDRAM). The present invention, however, is not limited to the examples of memory mentioned here.

Network controller 514 may represent any type of device that allows electronic appliance 500 to communicate with other electronic appliances or devices. In one embodiment, network controller 514 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 514 may be an Ethernet network interface card.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An electronic appliance, comprising:
   a processor, to process data;
   a memory, to store data;
   a network controller, to communicate data; and
   a processor socket coupled with the processor, the memory and the network controller, the processor socket comprising a table to protect socket contacts by providing a top surface a distance above the socket contacts when the table is in an up position and openings through which the socket contacts emerge to couple with the processor when the table is in a down position, the table containing integral springs to place the table in the up position when no force is applied and to place the table in the down position when an actuation force is applied.

2. The electronic appliance of claim 1, further comprising:
   the table containing openings of a size to accommodate the socket contacts including any wiping action.

3. The electronic appliance of claim 1, further comprising the table being captivated in the socket under integrated tabs within the socket.

4. A socket comprising: socket contacts, to couple with a device package; a socket housing, to hold the socket contacts and align the device package; a socket contact protector, to protect the socket contacts by providing a top surface a distance above the socket contacts when the socket contact protector is in an up position and opening through which the socket contacts emerge to couple with the device package when the socket contact protector is in a down position; and compressible springs to hold the socket contact protector in the up position in the absence of an actuation force; wherein the socket contact protector is a substantially planar plastic table; wherein the springs are integrated with the plastic table.

* * * * *